United States Patent [19]
Yamaguchi

[11] Patent Number: 5,898,336
[45] Date of Patent: Apr. 27, 1999

[54] CHARGING PUMP CIRCUIT AND A PHASE-LOCKED LOOP CIRCUIT USING THE SAME

[75] Inventor: Hiroshi Yamaguchi, Tokyo, Japan

[73] Assignee: NEC Corporation, Tokyo, Japan

[21] Appl. No.: 08/902,977

[22] Filed: Jul. 30, 1997

[30] Foreign Application Priority Data

Aug. 21, 1996 [JP] Japan .................................. 8-218977

[51] Int. Cl.[6] .................... H03L 7/089; H03L 7/08
[52] U.S. Cl. .................... 327/157; 327/536; 327/537; 327/156; 327/148; 327/147; 331/17; 331/8
[58] Field of Search .................... 327/157, 147, 327/589, 536, 141, 105, 148, 156, 537, 437; 331/17, 25, 1 A, 8

[56] References Cited

U.S. PATENT DOCUMENTS 5,136,260  8/1992  Yousefi-Elezei .................... 331/17

FOREIGN PATENT DOCUMENTS 4-20016   1/1992  Japan .
5-100768  4/1993  Japan .

OTHER PUBLICATIONS by Deog-Kyoon Jeong et al., "Design of PLL-Based Clock Generation Circuits", *IEEE Journal of Solid-State Circuits*, vol. SC-22, No. 2, Apr. 1987, pp. 255-261.

*Primary Examiner*—Dinh Je
*Attorney, Agent, or Firm*—Young & Thompson

[57] ABSTRACT

An improved charging pump circuit includes first, second, third and fourth switches connected together in series across an associated power supply, a first capacitor connected between the first and second switches and the ground, and a second capacitor connected between the third and fourth switches and the ground. One of the first and second switches responds to a first drive signal for turning into a conductive condition while holding the other switch in a non-conductive condition. Likewise, one of the third and fourth switches responds to a second drive signal for turning into the conductive condition while holding the other switch in a non-conductive condition. The time spent for charging or discharging the load capacitor can be substantially reduced by using the first and second capacitors whose capacitances are much smaller than the capacitance of a load capacitor, and accordingly jitter can be reduced in a PPL circuit in which the charging pump circuit is included.

4 Claims, 5 Drawing Sheets

F I G. 1
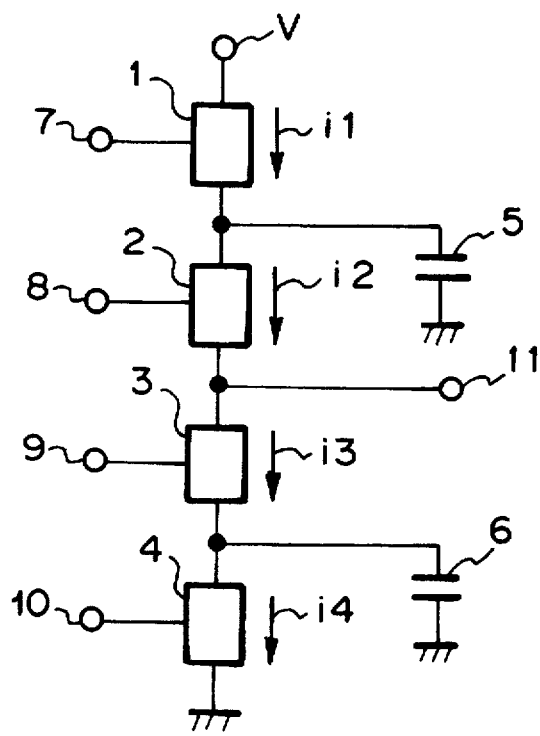
F I G. 3
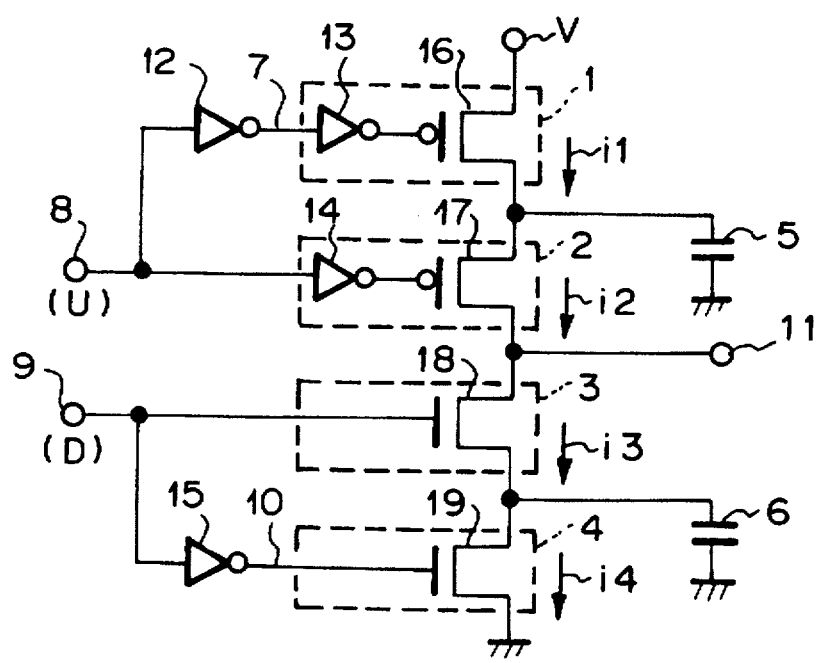

CHARGING PUMP CIRCUIT AND A PHASE-LOCKED LOOP CIRCUIT USING THE SAME

BACKGROUND OF THE INVENTION

1. Field of the Invention

The present invention relates to a charging pump circuit and a phase-locked loop circuit using the charging pump circuit, and more particularly to a charging pump circuit which is so constructed that the phase-locked loop circuit using the same may be affected by little or no jitter.

2. Prior Art

A phase-locked loop circuit (hereinafter acronym "PLL" will be used) is well known. Referring to FIG. 5, it comprises a phase comparator 63, a charging pump circuit 64 connected to the phase comparator 63, a loop filter 65 connected to the charging pump circuit 64, a voltage controlled oscillator (hereinafter acronym "VCO" will be used) 61 connected to the loop filter 65, and a frequency divider 62 whose input and output terminals are connected to the VCO 61 and to the phase comparator 63 respectively, thus making up a loop circuit. The phase comparator 63 is responsive to an exterior signal IN and a division of the oscillating signal from the VCO 61 for making a phase-comparison between them and providing a phase-leading signal U at its first output terminal and a phase-lagging signal D at its second output terminal. The charging pump circuit 64 is responsive to the signal U or D from the phase comparator 63 for providing a signal representing the phase difference when detected, and the loop filter 65 is responsive to the signal from the charging pump circuit for providing a control signal for the VCO 61. More specifically, in operation the oscillating signal from the VCO 61 is divided by the frequency divider 62 so that the frequency of the oscillating signal thus divided may be equal to the frequency of the exterior signal IN, and then the frequency-divided signal is supplied to the phase comparator 63, where a phase-comparison is made between the exterior signal IN and the frequency-divided signal.

In case that the exterior signal IN (standard) leads ahead of the oscillating signal in phase, the phase-comparator 63 provides a phase-leading signal U at its first output terminal. On the contrary, in case that the exterior signal IN (standard) lags behind the oscillating signal in phase, and then, the phase-comparator provides a phase-lagging signal D at its second output terminal.

The charging pump circuit 64 is driven by the phase-leading signal U and phase-lagging signal D from the phase-comparator 63 and produces a signal representing the phase difference and supplies it to the loop filter 65, where high-frequency components including noise signals are eliminated to provide a control voltage for the VCO 61. The PLL circuit will be locked when the oscillating output signal OUT is brought in phase-synchronism with the exterior signal IN.

Referring to FIG. 6A, one example of charging pump circuit 64 comprises a PMOS transistor 21 having an inverter 23 connected to its gate electrode and an NMOS transistor 22 connected in series to the PMOS transistor 21. Application of a phase-leading signal U to the PMOS transistor 21 via the inverter 28 will cause the transistor 21 to be turned on or off, whereas application of a phase-lagging signal D to the NMOS transistor 22 will cause the transistor 22 to be turned on or off.

FIG. 6B shows signal waveforms appearing at different points of the charging pump circuit 64. Usually a capacitive load is connected to the output terminal Y of the charging pump circuit 64. Application of a phase-leading signal U (HIGH) to the PMOS transistor 21 will cause an electric current i to flow through the transistor 21 now turned on, thereby charging the capacitive load with electricity. Accordingly the voltage rises at the output terminal Y. On the contrary, application of a phase-lagging signal D (HIGH) to the NMOS transistor 22 will allow an electric current i to flow through the transistor 22 now turned on to discharge the capacitive load. Accordingly the voltage descends at the output terminal Y.

FIG. 6B shows how the charging or discharging current i varies, and how the voltage at the output terminal Y varies. As seen from the drawing, the length of time taken for potential leveling and the change in output voltage increases with the duration of the phase-leading or phase-lagging pulse signal U or D. This is a major cause of the increase of jitter, which causes a side effect on a PLL circuit using such charging pump circuit.

SUMMARY OF THE INVENTION

One object of the present invention is to provide a charging pump circuit which causes less or no jitter in a PLL circuit incorporating the same regardless of the width of drive pulses.

To attain this object a charging pump circuit, which is driven by phase-leading signal and phase-lagging signal from a phase comparator which compares the phases of two input signals and drives an associated load therewith, is improved according to the present invention in which the charging pump circuit comprises: first, second, third and fourth switching means connected together in series across one and the other terminal of an associated power supply; a first capacitor whose capacitance is small compared with the capacitance of the associated load, connected between the joint between the first and second switching means and the other terminal of the power supply; and a second capacitor whose capacitance is small compared with the capacitance of the associated load, connected between the joint between the third and fourth switching means and the other terminal of the power supply, thereby allowing the first and second switching means to complementarily respond to the drive signal from the first output terminal of the associated phase-comparator representing the leading of one of the two input signals ahead of the other, and allowing the third and fourth switching means to complementarily respond to the drive signal from the other output terminal of the associated phase-comparator representing the lagging of the one input signal behind the other.

Each of said first and second switching means may comprise a transistor of the first conductivity type, whereas each of said third and fourth switching means may comprise a transistor of the second conductivity type.

A phase-locked loop circuit comprising a voltage controlled oscillator, a phase comparator responsive to an exterior signal and the signal from the voltage controlled oscillator for making a phase-comparison between them and for providing a signal representing a phase difference, a charging pump circuit responsive to the signals from the phase comparator for providing a signal as a function of the phase difference, and a loop filter responsive to the signal from the charging pump circuit for providing a control signal for the voltage controlled oscillator, is improved according to the present invention in which the charging pump circuit comprises: first, second, third and fourth switching means connected together in series across one and the other terminal of an associated power supply, the phase comparator being connected to the first and second switching means at its first output terminal and to the third and fourth switching means at its second output terminal, and the loop filter being connected to the joint between the second and third switching means; a first capacitor whose capacitance is small compared with the capacitive load on the output side, connected between the joint between the first and second switching means and the other terminal of the power supply; and a second capacitor whose capacitance is small compared with the capacitive load on the output side, connected between the joint between the third and fourth switching means and the other terminal of the power supply, thereby allowing the first and second switching means to respond complementarily to the drive signal from one of the first and second output terminals of the phase-comparator representing the leading of one of the two input signals ahead of the other, and allowing one of the third and fourth switching means to respond complementarily to the drive signal from the other output terminal of the phase-comparator representing the lagging of the one input signal behind the other.

Other objects and advantages of the present invention will be understood from the following description of charging pump circuits according to preferred embodiments of the present invention, which are shown in accompanying drawings:

BRIEF DESCRIPTION OF DRAWINGS

FIG. 1 shows diagrammatically the arrangement of the charging pump circuit according to the principle of the present invention;

FIG. 3 shows a charging pump circuit according to one embodiment of the present invention;

DESCRIPTION OF PREFERRED EMBODIMENTS

Figure 2:
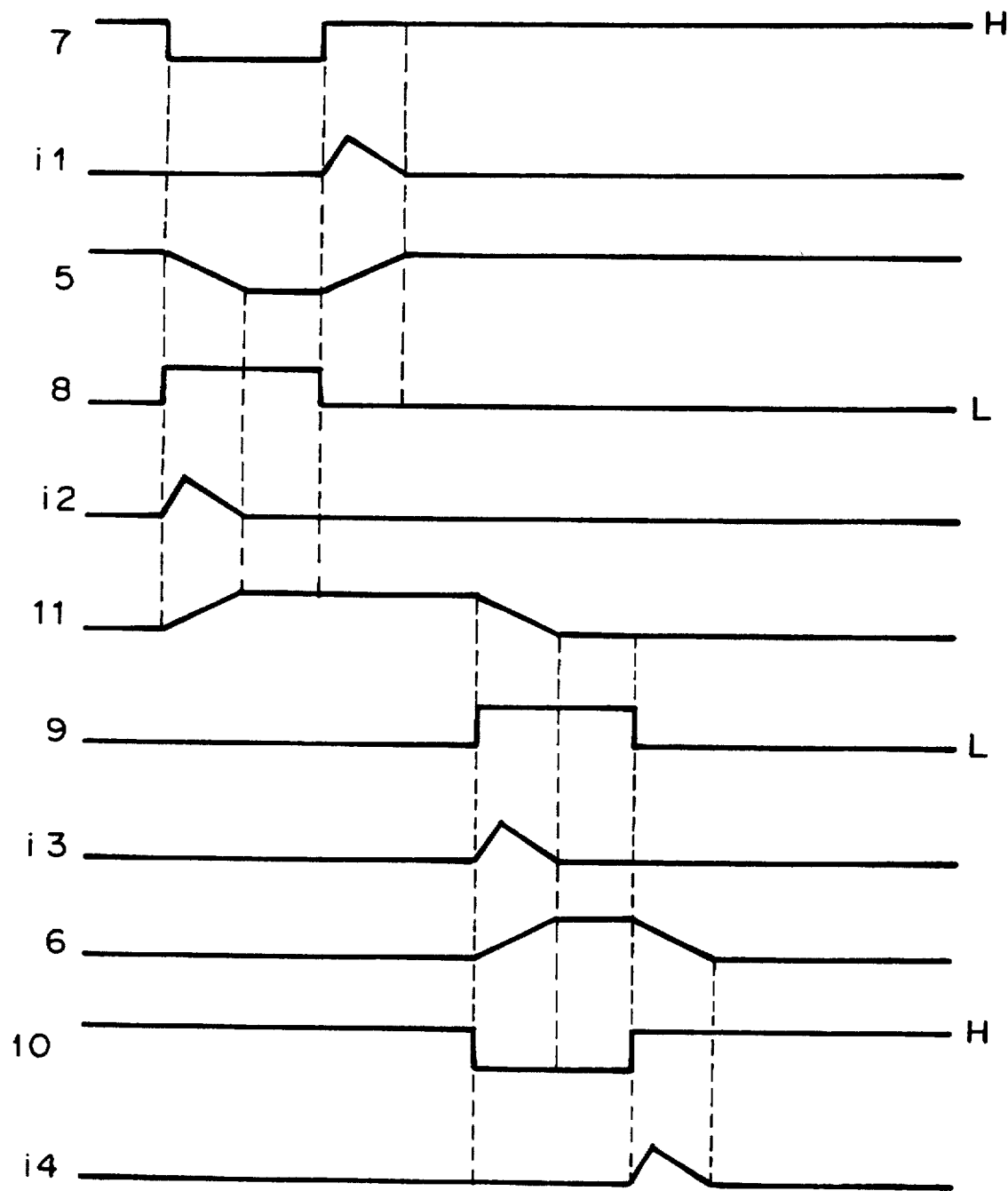
FIG. 2 shows waveforms appearing at different points of the circuit arrangement of FIG. 1.

Referring to FIG. 1, a charging pump circuit according to the present invention includes first, second, third and fourth switching devices 1 through 4 connected together in series across an associated power supply VDD and the ground. A first capacitor 5 is connected between the joint between the first and second switching devices 1 and 2 and the ground, and a second capacitor 6 is connected between the joint between the third and fourth switching devices 3 and 4 and the ground. An output terminal 11 is connected to the joint between the second and third switching devices 2 and 3. Application of high-level control signals (HIGH) to the input terminals 7 through 10 of these switching devices 1 through 4 will cause them to be turned on, and application of low-level control signals (LOW) to input terminals 7 through 10 of the switching devices 1 through 4 will cause them to be turned off. Here, it should be noted that the switching devices 1 and 2 (or 3 and 4) are driven by complementary control signals, thereby putting one of these switching devices 1 and 2 (or 3 and 4) in conductive condition while switching the other in non-conductive condition.

Referring to FIG. 2, the charging pump circuit of FIG. 1 works as follows: while the control signal remains HIGH at the input terminal 7 of the first switching device 1, the control signal remains LOW at the input terminal 8 of the second switching device 2, and vice versa. Therefore, one of the switching devices 1 and 2 is turned on, and the other switching device is turned off. These switching devices 1 and 2 cannot be turned on simultaneously, nor can be turned off simultaneously.

Likewise, while the control signal remains HIGH at the input terminal 9 of the third switching device 3, the control signal remains LOW at the input terminal 10 of the fourth switching device 4, and vice versa. Therefore, these switching devices 3 and 4 are turned on and off in inverse relation, and they cannot be turned on (or off) simultaneously.

In operation, while the control signal remains HIGH at the input terminal 7 of the first switching device 1, the electric current i1 flows through the switching device 1 now turned-on to charge the capacitor 5 with electricity (see the waveform of charging current i1 in FIG. 2).

While the control signal remains HIGH at the input terminal 8 of the second switching device 2, the electric current i2 flows through the switching device 2 now turned-on, thus permitting the capacitor 5 to discharge electricity to the output terminal 11, thereby raising the electrical potential at the output terminal 11 (see the waveform of discharging current i2 in FIG. 2).

While the control signal remains HIGH at the input terminal 9 of the third switching device 3, the electric current i3 flows from the output terminal 11 to the capacitor 6 through the switching device 3 now turned-on to charge the capacitor 6 with electricity, and accordingly the potential at the output terminal 11 is lowered (see the wave form of charging current i3 in FIG. 2).

Finally, while the control signal remains HIGH at the input terminal 10 of the fourth switching device 4, the electric current i4 flows through the switching device 4 now turned-on, thus permitting the capacitor 6 to discharge electricity to the ground (see the waveform of discharging current i4 in FIG. 2).

Referring to FIG. 3, a charging pump circuit according to a first embodiment of the present invention includes a first switching device 1 comprising a P-type MOS transistor 16 and an associated inverter 13, a second switching device 2 comprising a P-type MOS transistor 17 and an associated inverter 14, a third switching device 3 comprising an N-type MOS transistor 18, and a fourth switching device 4 comprising an N-type MOS transistor 19. An inverter 12 is connected between the first switching device 1 and the input terminal 8, and likewise, an inverter 15 is connected between the fourth switching device 4 and the input terminal 9.

With this arrangement, in one instance a control signal U (HIGH) appears at the terminal 8 to be applied to the gate electrode of the P-type MOS transistor 16 via the inverters 12 and 13 (the inverted control signal (LOW) appearing at the input terminal 7), and simultaneously the control signal U (HIGH) is inverted by the inverter 14 and then, the inverted control signal U (LOW) is applied to the gate electrode of the P-type MOS transistor 17. Thus, the transistors 16 and 17 are driven in complementary fashion. In another instance another control signal D (HIGH) appears at the terminal 9 to be applied directly to the gate electrode of the N-type MOS transistor 18, and simultaneously the control signal D (HIGH) is inverted by the inverter 15, and then, the inverted control signal D (LOW) appears at the terminal 10 to be applied to the gate electrode of the N-type MOS transistor 19. Thus, the transistors 18 and 19 are driven in complementary fashion.

As may be readily understood, the charging pump circuit of FIG. 3 works in the same way as the circuit arrangement of FIG. 1, and as shown in FIG. 2. Therefore, the charging pump circuit of FIG. 3 can attain a proper roll in a PLL circuit if it is so incorporated therein as to receive a phase-leading signal U and a phase-lagging signal D from the antecedent phase comparator at its input terminals 8 and 9 respectively.

Figure 4A:
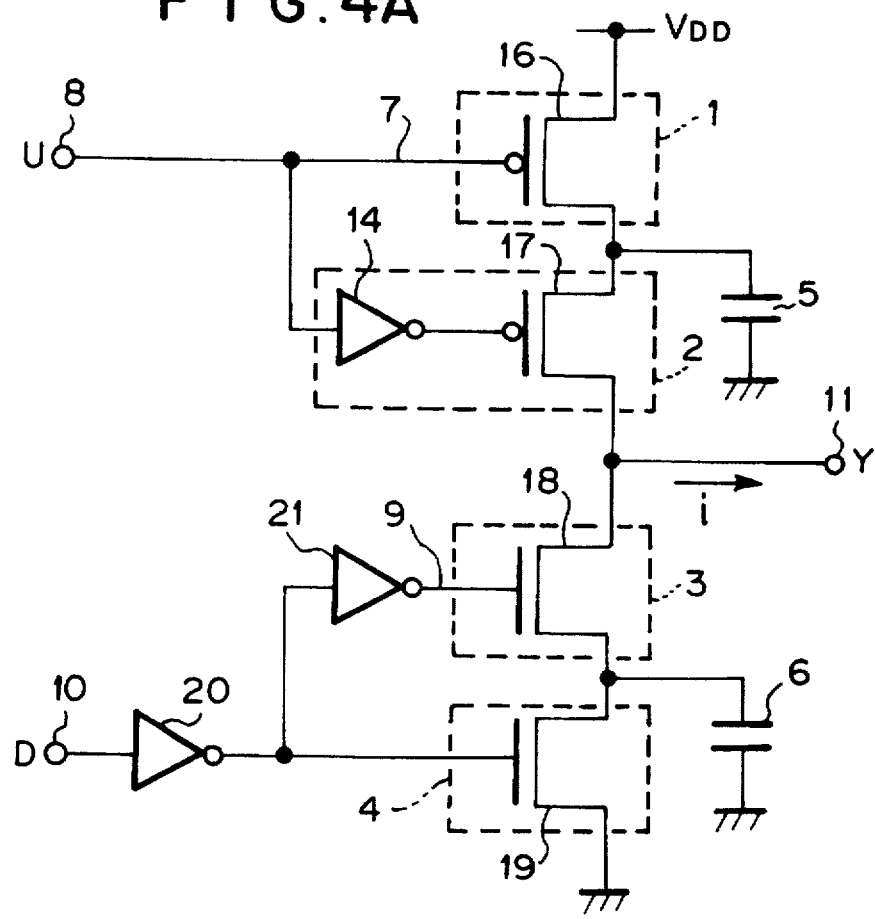
FIG. 4A shows a charging pump circuit according to another embodiment of the present invention.

Referring to FIG. 4A, a charging pump circuit according to another embodiment of the present invention includes a first switching device 1 comprising a P-type MOS transistor 16, a second switching device 2 comprising a P-type MOS transistor 17 and an associated inverter 14, a third switching device 3 comprising an N-type MOS transistor 18, and a fourth switching device 4 comprising an N-type MOS transistor 19. An inverter 20 is connected between the fourth switching device 4 and the input terminal 10, and another inverter 21 is connected between the third switching device 3 and the joint between the fourth switching device 4 and the inverter 20.

Figure 4B:
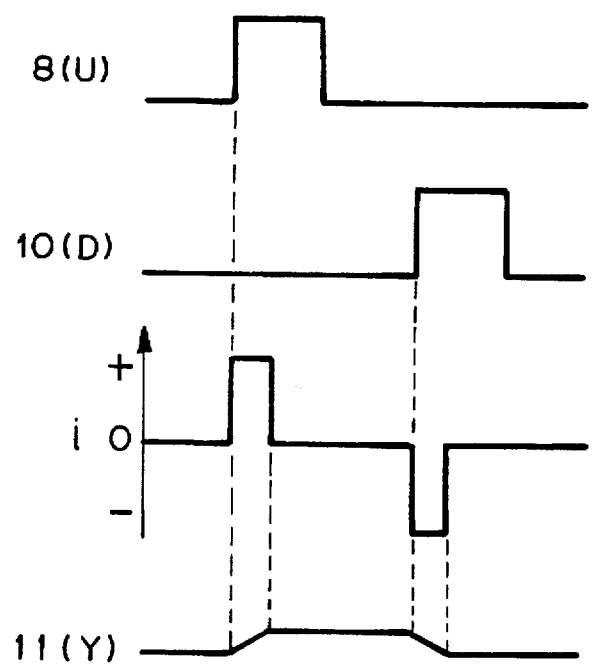
FIG. 4B shows waveforms appearing at different points of the a charging pump circuit.
Figure 5:
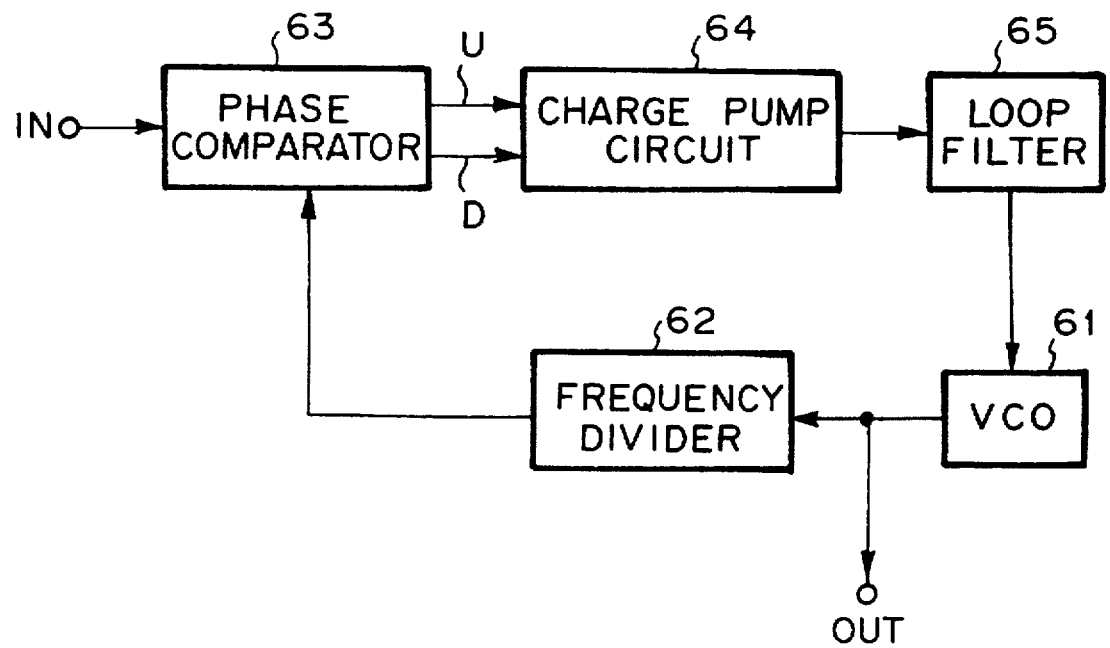
FIG. 5 is a block diagram of PLL circuit.
Figure 6A:
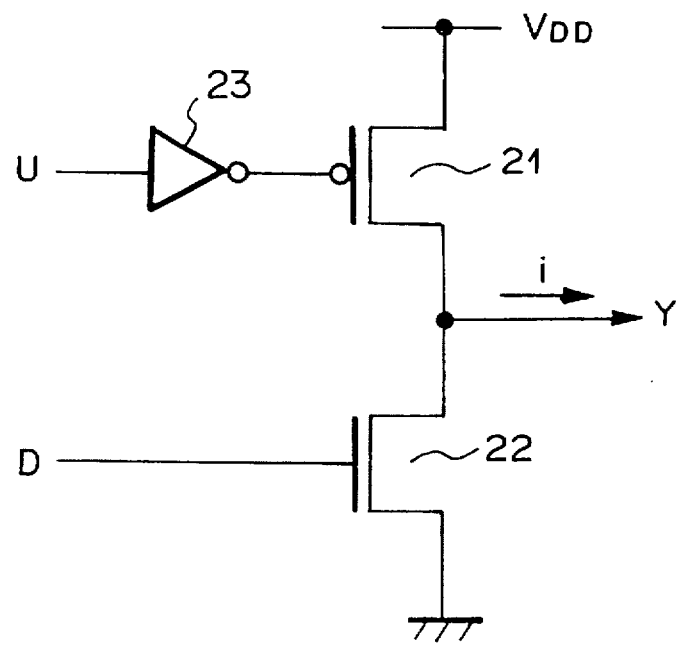
FIG. 6A shows a conventional charging pump circuit for the PLL circuit of FIG. 5.
Figure 6B:
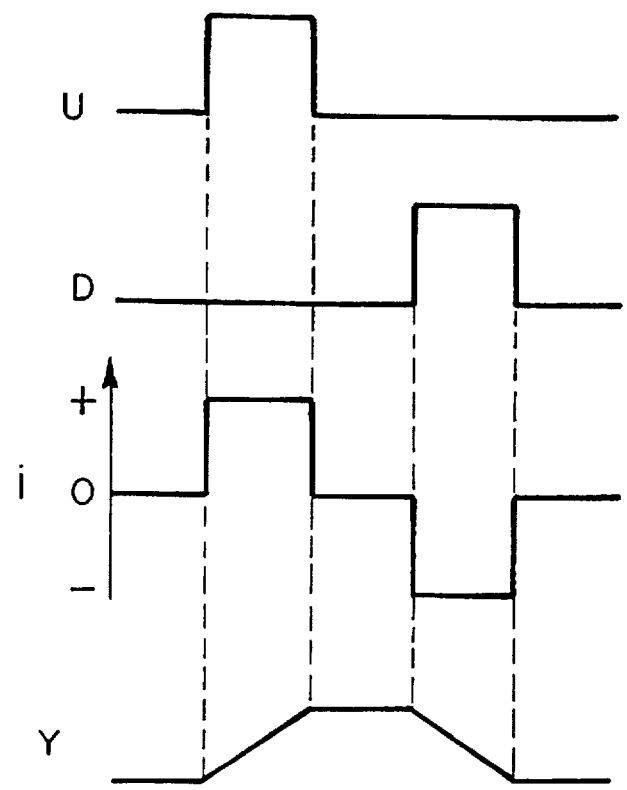
FIG. 6B shows a waveforms appearing at various points in the charging pump circuit of FIG. 6A.

Referring to FIG. 4B, the charging pump circuit works as follows: while a phase-leading control signal U remains LOW at the input terminal 8, the first switching device 1 is put in the "on"-condition, whereas the second switching device 2 is put in the "off"-condition. Thus, the capacitor 5 is charged with electricity. On the contrary, while a phase-leading control signal U remains HIGH at the input terminal 8, the first switching device 1 is put in the "off"-condition, whereas the second switching device 2 is put in the "on"-condition. Thus, the capacitor 5 is allowed to discharge electricity to the output terminal 11.

While a phase-lagging control signal D remains HIGH at the input terminal 10, the third switching device 3 is put in the "on"-condition, whereas the fourth switching device 4 is put in the "off"-condition. Then, a charging current flows from the output terminal 11 to the capacitor 6 through the third switching device 3 now in the "on"-condition. On the contrary, while a phase-lagging control signal D remains LOW at the input terminal 8, the third switching device 3 is put in the "off"-condition, whereas the fourth switching device 4 is put in the "on"-condition. Thus, the capacitor 6 is allowed to discharge electricity to the ground.

Therefore, the charging pump circuit of FIG. 4A can attain a proper roll in a PLL circuit if it is so incorporated therein as to receive a phase-leading signal U and a phase-lagging signal D from the antecedent phase comparator at its input terminals 8 and 9 respectively.

As described above, the capacitor 5 is charged with electricity while a phase-leading control signal U remains LOW at the input terminal 8, and the charging will stop when the voltage across the capacitor 5 is equal to the voltage of the power supply VDD. The amount of electricity with which the capacitor 5 has been charged is determined by the capacitance of the capacitor 5 and the voltage of the power supply VDD. The capacitance of the capacitor 5 is smaller than the load capacitance connected to the output terminal 11, and accordingly the amount of electricity is small. The small amount of electricity is allowed to be discharged from the capacitor 5 when the phase-leading control signal turns HIGH. Thus, the time taken for potential leveling can be reduced due to use of small capacitance 5. The capacitor 6 is charged with electricity while a phase-lagging control signal D remains HIGH at the input terminal 10, and the charging will stop when the voltage across the capacitor 6 is equal to the voltage of the load. The amount of electricity with which the capacitor 6 has been charged is determined by the capacitance of the capacitor 6 and the voltage of the load. The capacitance of the capacitor 6 is smaller than the load capacitance connected to the output terminal 11, and accordingly the amount of electricity is small. The small amount of electricity is allowed to be discharged from the capacitor 6 when the phase-lagging control signal turns LOW. Thus, the time taken for potential leveling can be reduced due to use of small capacitance 6. Use of capacitors 5 and 6 whose capacitance is much smaller than the load capacitance on the output side 11 will effectively suppress the appearance of jitter.

As may be understood from the above, due to the charging or discharging from the output terminal 11 through the small capacitance 5 or 6, the time spent for the voltage appearing at the output terminal 11 to make the transition to the leveling point on the waveform (or rise time and fall time) can be significantly shortened as seen from the waveform 11 in FIG. 2 or FIG. 4B. Use of the capacitors 5 and 6 whose capacitance is small, compared with the load capacitance connected to the output terminal 11, therefore, will effectively suppress jitters in a PLL circuit having such charging pump circuit incorporated therein.

Also, it should be noted that there is no direct channel from the power supply to the ground at all times, and therefore, the charging pump circuit is guaranteed to be free of the loss of electric power which otherwise, would be caused by the leakage current ceaselessly flowing from the power supply.

What is claimed is:

1. A charging pump circuit responsive to a phase leading signal and a phase lagging signal for providing an output signal related to the phase-leading signal and the phase-lagging signal, which comprises:

a first input terminal for receiving the phase-leading signal;

a second input terminal for receiving the phase-lagging signal;

first, second, third and fourth switching means connected together in series between a first power supply and a second power supply, a control terminal of said second switching means being connected to said first input terminal, a control terminal of said third switching means being connected to said second input terminal;

a first capacitor connected between a junction of said first and second switching means and said second power supply;

a second capacitor connected between a junction of said third and fourth switching means and said second power supply;

a first inverter with an input terminal connected to said first input terminal and an output terminal connected to a control terminal of said first switching means;

a second inverter with an input terminal connected to said second input terminal and an output terminal connected to a control terminal of said fourth switching means; and a charge pump output terminal connected to a junction between said second and third switching means, wherein responses of said first and second switching means to said phase-leading signal are complementary, and wherein responses of said third and fourth switching means to said phase-lagging signal are complementary.

2. The charging pump circuit according to claim 1, wherein each of said first and second switching means comprises a transistor of a first conductivity type, whereas each of said third and fourth switching means comprises a transistor of a second conductivity type.

3. A phase-locked loop circuit comprising:

a voltage controlling oscillator;

a phase comparator responsive to an exterior signal and a signal from said voltage controlled oscillator for making a phase-comparison between them and for providing a phase-leading signal and a phase-lagging signal from first and second output terminals, respectively, said phase-leading signal being provided from said first output terminal when a phase of one of said exterior signal and said signal from said voltage controlled oscillator leads a phase of the other of said signals, said phase-lagging signal being provided from said second output terminal when said phase of said one of said exterior signal and said signal from said voltage controlled oscillator lags said phase of the other of said signals;

a charge pump circuit responsive to the phase-leading and phase-lagging signals from said phase comparator for providing an output signal related to a phase difference when detected;

a loop filter responsive to the output signal from said charging pump circuit for providing a control signal for said voltage controlled oscillator;

said charging pump circuit comprising:

a first input terminal to which said phase-leading signal is supplied;

a second input terminal to which said phase-lagging signal is supplied;

first, second, third and fourth switching means connected together in series between a first power supply and a second power supply, a control terminal of said second switching means being connected to said first input terminal, a control terminal of said third switching means being connected to said second input terminal;

a first capacitor connected between a junction of said first and second switching means and said second power supply;

a second capacitor connected between a junction of said third and fourth switching means and said second power supply;

a first inverter with an input terminal connected to said first input terminal and an output terminal connected to a control terminal of said first switching means;

a second inverter with an input terminal connected to said second input terminal and an output terminal connected to a control terminal of said fourth switching means; and a charge pump output terminal connected to a junction between said second and third switching means, wherein responses of said first and second switching means to said phase-leading signal are complementary, and wherein responses of said third and fourth switching means to said phase-lagging signal are complementary.

4. The phase-locked loop circuit according to claim 3, wherein each of said first and second switching means comprises a transistor of a first conductivity type, whereas each of said third and fourth switching means comprises a transistor of a second conductivity type.

* * * * *